US005895766A

United States Patent [19]

Manning

[11] Patent Number: 5,895,766

[45] Date of Patent: *Apr. 20, 1999

[54] METHOD OF FORMING A FIELD EFFECT TRANSISTOR

[75] Inventor: Monte Manning, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/530,662

[22] Filed: Sep. 20, 1995

[51] Int. Cl.[6] .................... H01L 21/336

[52] U.S. Cl. .................... 438/305; 438/299; 438/592; 438/620; 438/653

[58] Field of Search .................... 437/40 R, 41 R, 437/41 TFT, 40 TFT, 40 GS, 41 GS, 45, 56–59, 190, 192, 203; 438/299, 305, 592, 620, 653

[56] References Cited

U.S. PATENT DOCUMENTS

| | | | |
|---|---|---|---|
| 4,914,050 | 4/1990 | Shibata | 437/38 |
| 4,946,799 | 8/1990 | Blake et al. | 437/41 |
| 4,969,020 | 11/1990 | Matsushita | 257/376 |
| 5,026,656 | 6/1991 | Matloubian et al. | 437/45 |
| 5,084,416 | 1/1992 | Ozaki et al. | 437/190 |
| 5,241,211 | 8/1993 | Tashiro | 257/506 |
| 5,315,150 | 5/1994 | Furuhata | 437/192 |
| 5,326,991 | 7/1994 | Takasu | 257/350 |
| 5,364,817 | 11/1994 | Lur et al. | 437/190 |
| 5,412,493 | 5/1995 | Kunii et al. | 437/41 TFT |
| 5,440,173 | 8/1995 | Evans, Jr. et al. | 437/190 |
| 5,728,626 | 3/1998 | Allyman et al. | 438/608 |

FOREIGN PATENT DOCUMENTS

| | | | |
|---|---|---|---|
| 0104754 | 4/1984 | European Pat. Off. | 257/382 |

OTHER PUBLICATIONS

F. Pintchoviski et al., "TiN Metallization Barriers: From 1.2v to 0.35v Technology", Mat. Res. Soc. Symp., vol. 260, 1992, pp. 777–785.

Laura Peters, "SOI Takes Over Where Silicon Leaves Off", Semiconductor International, Mar. 1993, pp. 48–51.

S. A. Sze, "Semiconductor Devices Physics and Technology," pp. 110–111 (1985).

*Primary Examiner*—Michael Trinh

*Attorney, Agent, or Firm*—Wells, St. John, Roberts, Gregory & Matkin, P.S.

[57] ABSTRACT

A method of forming a field effect transistor includes, a) providing a silicon substrate having impurity doping of a first conductivity type; b) providing source and drain diffusion regions of a second conductivity type within the silicon substrate, the source region and the drain region being spaced from one another to define a channel region therebetween within the silicon substrate; c) providing a gate relative to the silicon substrate operatively adjacent the channel region; and d) providing respective ohmic electrical contacts to the source region and the drain region, the electrical contact to the source region comprising a substrate leaking junction, the electrical connection to the drain region not comprising a substrate leaking junction. A field effect transistor is also disclosed.

6 Claims, 4 Drawing Sheets

METHOD OF FORMING A FIELD EFFECT TRANSISTOR

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to integrated circuitry and to methods of forming field effect transistors.

BACKGROUND OF THE INVENTION

Field effect transistors are comprised of a pair of diffusion regions, referred to as a source and a drain, spaced apart within a semiconductive substrate. Such include a gate provided adjacent the separation region between the diffusion regions for imparting an electric field to enable current to flow between the diffusion regions. The substrate area adjacent the gate and between the diffusion regions is referred to as the channel. The semiconductive substrate typically comprises a bulk monocrystalline silicon substrate having a light conductivity dopant impurity concentration. Alternately, the substrate can be provided in the form of a thin layer of lightly doped semiconductive material (typically monocrystalline silicon) over an underlying insulating layer. Such are commonly referred to as semiconductor-on-insulator (SOI) constructions.

The diffusion regions in SOI can extend completely or partially through the thin silicon layer. Further, the SOI device can operate in a partially depleted or fully depleted mode. Such refers to the depletion region formed in the SOI layer when the channel region is inverted by applied voltage. If the depletion region extends through the entire SOI layer, the device is considered to be fully depleted. If on the other hand the depletion region extends only partly through the SOI layer, the device is considered to be partially depleted. Usually, the source and drain regions in a partially depleted device extend only partially through the SOI layer. Usually, the source and drain regions in a fully depleted device extend completely through the SOI layer.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths greater than 2 microns) to short-channel devices (i.e., channel lengths less than 2 microns).

In an n-type (NMOS) device, when the gate voltage is above the threshold voltage, and the drain voltage becomes sufficiently high so that the device is in the saturation region, the inversion region in the channel becomes pinched off near the drain and electrons are accelerated across this pinch-off region from the channel to the drain. At certain gate and drain bias conditions, the electric fields in the pinch-off region are high enough to cause the accelerated electrons to impact into substrate atoms. The result of this impact is the generation of additional electron-hole pairs. The electrons flow either into the gate oxide or gate conductor, or to the drain. The holes flow into the substrate. In bulk MOS devices, these excess holes are collected at a substrate tie. A substrate tie constitutes a fourth terminal of a MOS device and controls the substrate bias of the device. If the substrate tie terminal is at a large distance from the device, or if the generated holes are of a very high number, excess holes collect under the device's channel region.

These excess holes locally bias the substrate to a potential that is higher than that being provided at the substrate tie. If this higher potential rises above the source potential of the NMOS device, the source/body junction becomes forward biased and a parasitic n-p-n bipolar device is turned "on". The source acts as the emitter, the body is the base, and the drain is the collector. At this point, the NMOS device has entered what is referred to as the "snap-back" regime, and the drain current rises significantly above the intrinsic saturation current of the device. Operating an NMOS device in snap-back significantly reduces its lifetime, and is not a preferred mode of operation in typical integrated circuits.

Snap-back is a much larger concern with partially depleted SOI devices because there is no substrate tie to collect excess holes that are generated during impact ionization. Therefore, the substrate rises much sooner and the snap-back voltage is reduced when compared to an equivalent bulk-MOS device. Further, in SOI a common electrical characteristic observed is the "kink" effect. This is a result of the same phenomenon as snap-back, but occurs at lower drain electric fields. The "kink" in the SOI MOS devices Id-Vd curves (when the device is in saturation) is the result of a rise in the substrate potential due to hole injection from impact ionization at the drain. The holes do not cause forward bias of the source/substrate junction, but the small rise in substrate potential causes the threshold voltage of the MOS device to slightly decrease, thereby increasing the drain current and causing the kink Id-Vd characteristics.

Again, one prior art way of countering this phenomena is to add a conductive substrate tie to collect excess holes that are injected into the substrate. This prevents local biasing of the substrate, and therefore prevents the kink effect and increases the snapback voltage. In bulk devices, this substrate contact can be made anywhere in the vicinity of the device since the substrate is continuous from the substrate tie to the device body. However in SOI devices, the device body may be isolated from adjacent devices. To make body contact to such a device, an added p+ active area is abutted to the typical n+ source of an n-channel device. The p+ active area adjacent to or within the n+ source makes ohmic contact to the body of the device. However, it requires additional area, and a method to contact the p+ region as well as the n+ regions.

Another method for making this body contact in SOI is to not completely isolate one field effect transistor region from another. This, however, eliminates one of the major advantages of SOI, that of being able to reduce active area spacing from n-channel to p-channel devices.

It would be desirable to develop a method to provide the substrate electrical contact to completely isolated devices without requiring added layout area.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a field effect transistor comprises the following steps:

providing a silicon substrate having impurity doping of a first conductivity type;

providing source and drain diffusion regions of a second conductivity type within the silicon substrate, the source region and the drain region being spaced from one another to define a channel region therebetween within the silicon substrate;

providing a gate relative to the silicon substrate operatively adjacent the channel region; and providing respective ohmic electrical contacts to the source region and the drain region, the electrical contact to the source region comprising a substrate leaking junction, the electrical connection to the drain region not comprising a substrate leaking junction.

In accordance with another aspect of the invention, a field effect transistor comprises:

a silicon substrate having impurity doping of a first conductivity type;

a second conductivity type source diffusion region and a second conductivity type drain diffusion region within the silicon substrate, the source region and the drain region being spaced from one another to define a channel region therebetween within the silicon substrate;

a gate positioned relative to the silicon substrate operatively adjacent the channel region;

an insulating dielectric layer overlying the silicon substrate; and respective ohmic electrical contacts provided through the insulating dielectric layer to the source region and to the drain region, the electrical contact to the source region comprising a substrate leaking junction, the electrical connection to the drain region not comprising a substrate leaking junction.

Figure 1:
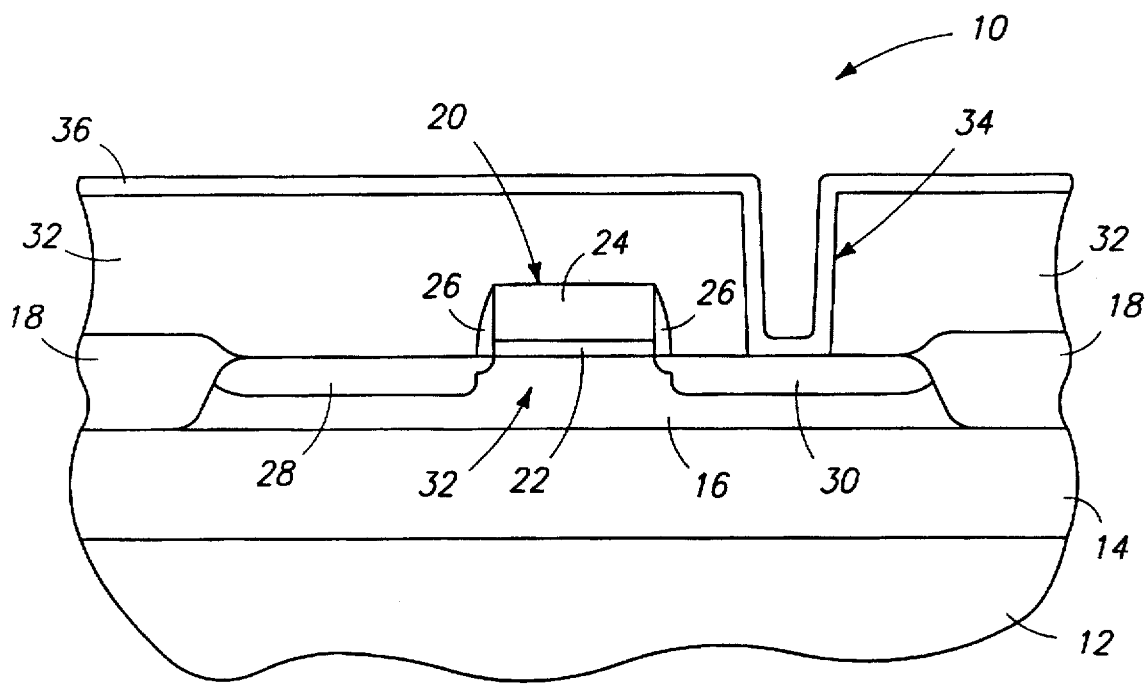
FIG. 1 is a diagrammatic sectional view of a semiconductor wafer fragment at one processing step in accordance with the invention.
Figure 2:
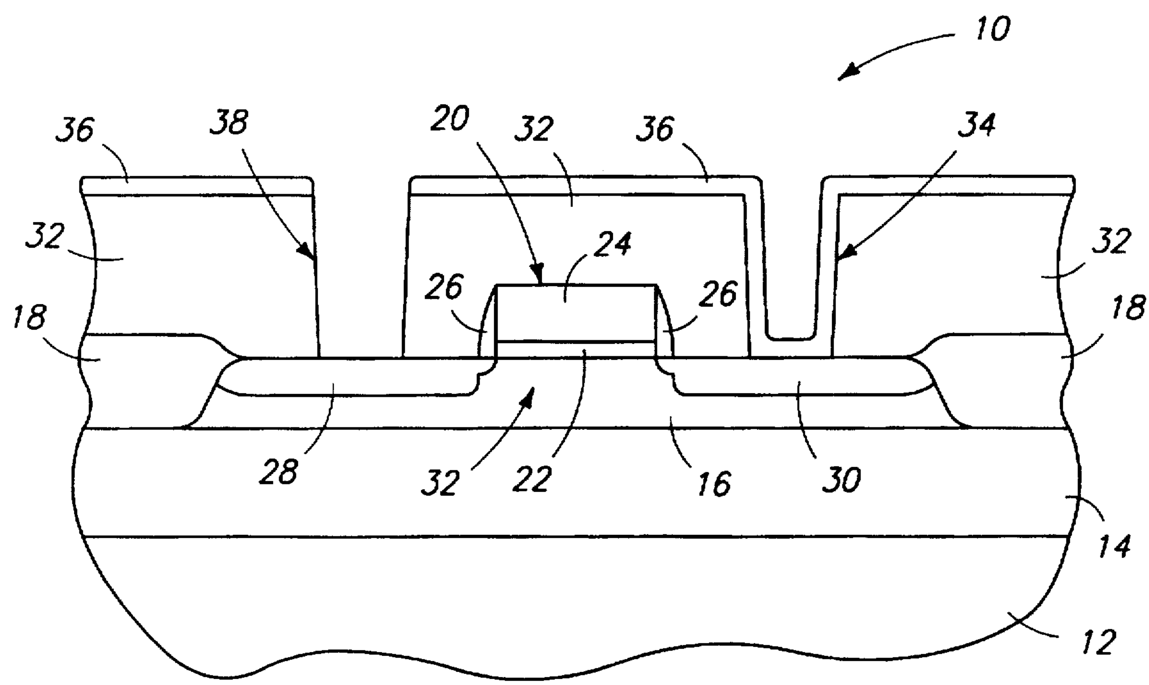
FIG. 2 is a view of the FIG. 1 wafer fragment at a processing step subsequent to that shown by FIG. 1.
Figure 3:
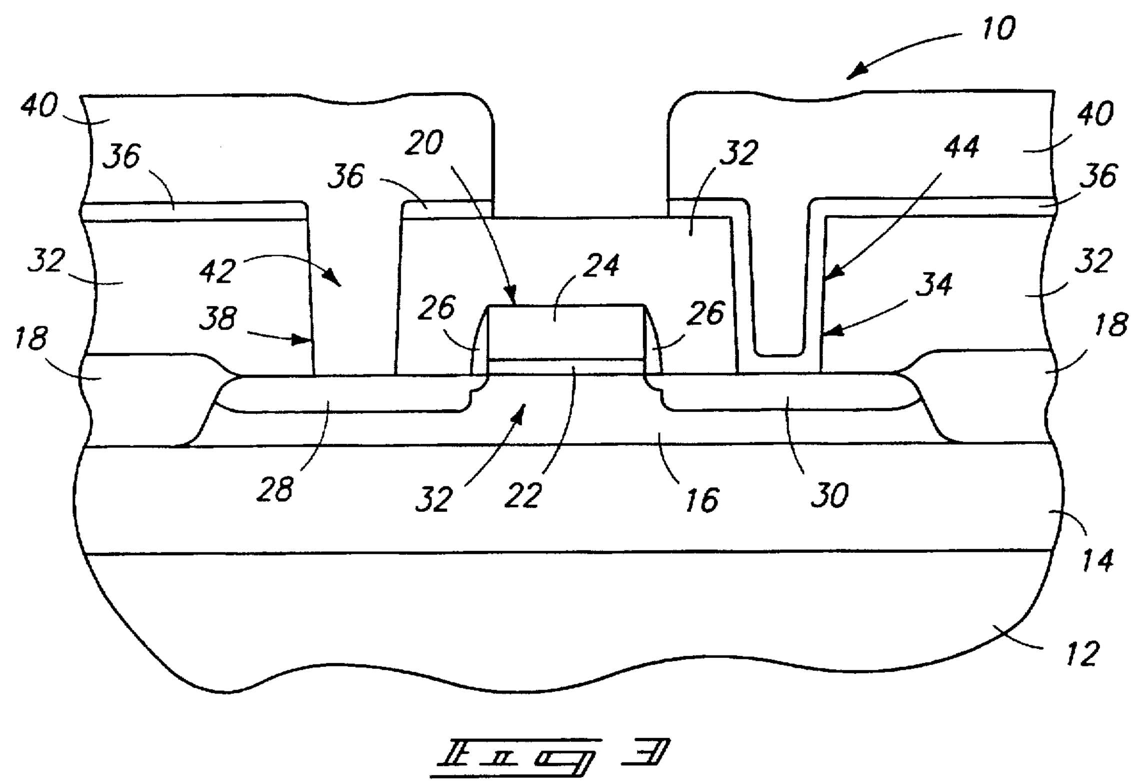
FIG. 3 is a view of the FIG. 1 wafer fragment shown at a processing step subsequent to that shown by FIG. 2.

The discussion proceeds initially with reference to FIGS. 1–3 of one method of forming a field effect transistor in accordance with the invention. FIG. 1 illustrates a semiconductor wafer fragment indicated generally by reference numeral 10. Such comprises a bulk substrate region 12 having an electrically insulating layer 14 provided thereatop. A silicon layer 16, preferably monocrystalline silicon, is provided outwardly of insulating layer 14. Such is lightly doped with a conductivity enhancing impurity of a first type. A typical and preferred dopant concentration for layer 16 is $5\times10^{17}$ ions/$cm^3$. Accordingly in this first described embodiment, layer 16 comprises a silicon substrate in the form of a silicon-on-insulator layer.

Field oxide regions 18 are provided relative to silicon substrate 16 as shown, as well as an intervening field effect transistor gate construction 20. Such comprises a gate oxide layer 22 having an overlying conductive region 24. Conductive region 24 would typically comprise conductively doped polysilicon having an overlying layer of a silicide, such as $WSi_x$. Electrically insulative sidewall spacers 26 are provided about gate layer 24 and gate oxide layer 22. An insulative cap (not shown) would also preferably be provided. Source and drain diffusion regions 28 and 30, respectively, of a second conductivity type are provided within silicon substrate 16. Such are spaced from one another as shown to define a channel region 32 therebetween within silicon substrate layer 16. Gate 20 is provided relative to silicon substrate layer 16 operatively adjacent channel region 32. In the preferred embodiment, the first conductivity type is "p" and the second conductivity type is "n". Further, and in the context of an SOI construction, at least source diffusion region 28 extends only partially through the silicon on insulator layer, with both of the source and drain preferably extending only partially through the silicon on insulator layer as shown.

An insulating dielectric layer 32 is provided over silicon substrate 16. A drain contact opening 34 is etched therethrough to drain region 30. An electrically conductive barrier layer 36 (preferably TiN) is provided over insulating dielectric layer 32 and within drain contact opening 34 in electrical connection with drain 30. Utilization of such a diffusion barrier layer is common in microelectronic fabrication to prevent interdiffusion or reaction of a subsequently deposited metalization layer and the underlying silicon substrate. Such also provides the added benefit of preventing junction spiking from occurring through the diffusion region into the substrate in operation of the circuitry.

Referring to FIG. 2, a source contact opening 38 is etched through electrically conductive barrier layer 36 and insulating dielectric layer 32 to source region 28.

Referring to FIG. 3, an electrically conductive layer 40 (preferably tungsten or aluminum) is provided over barrier layer 36 and within source and drain contact openings 38 and 34, respectively, to preferably fill such openings with electrically conductive material, and provide patterned conductive lines. Conductive layer 40 and underlying electrically conductive barrier layer 36 are patterned as shown to define a pair of ohmic electrical contacts 42 and 44 to source and drain regions 28 and 30, respectively. Electrical contact 42 to source region 28 is oriented to extend outwardly away relative to silicon substrate 16, and comprises a substrate leaking junction due to reaction of electrically conductive layer 42 with the silicon in the source region 28 due to a lack of barrier layer material 36 within source contact opening 38. Drain contact 44, on the other hand, is not a substrate leaking junction due to presence of barrier layer material 36 within drain contact opening 34.

Thus, a substrate leaking junction preferably in the form of a junction spike is created at the source therethrough to the substrate. At the source, no leakage would effectively occur with the prior art since the source is typically biased at the same potential as the substrate. However in accordance with this preferred aspect of the invention, ohmic contact is provided to the source junction as well as to the substrate, but not at the drain, to provide the desired substrate tie to contend with kink effect and low snapback voltage.

Figure 7:
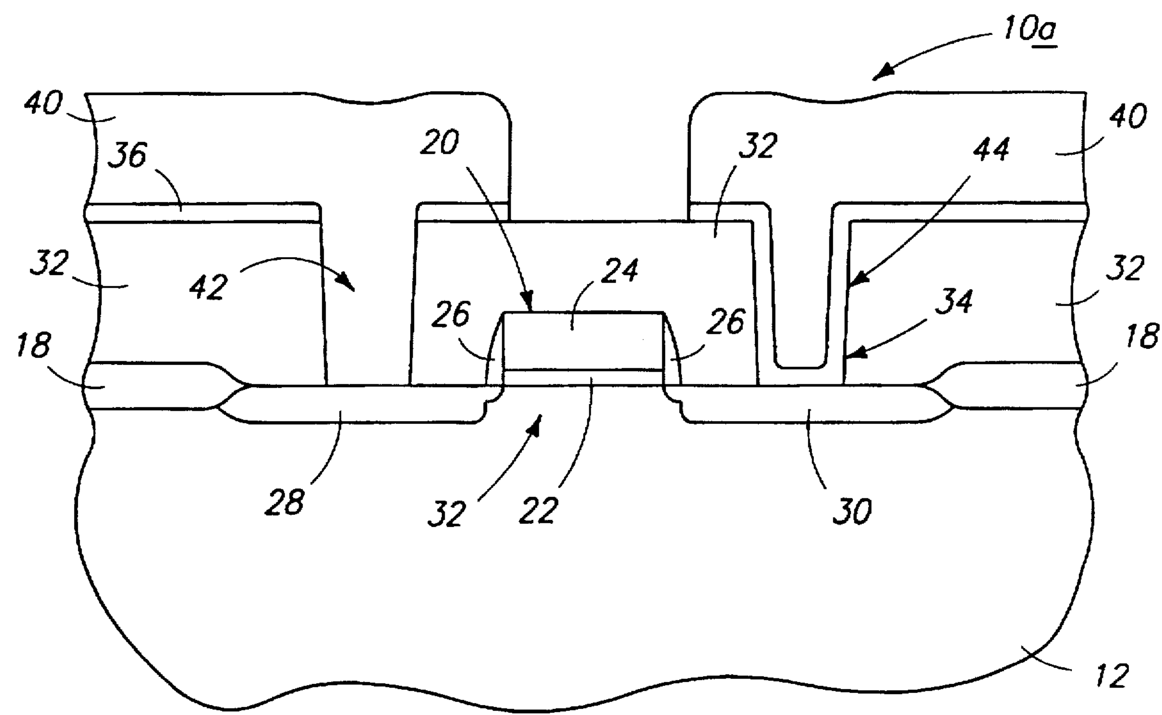
FIG. 7 is a diagrammatic sectional view of yet another alternate embodiment semiconductor wafer fragment at one processing step in accordance with the invention.

FIG. 7 illustrates an alternate embodiment wafer fragment 10*a* having the same essential construction as FIG. 3, but utilizing bulk silicon substrate 12 for formation of the field effect transistor, as opposed to a SOI device.

Figure 4:
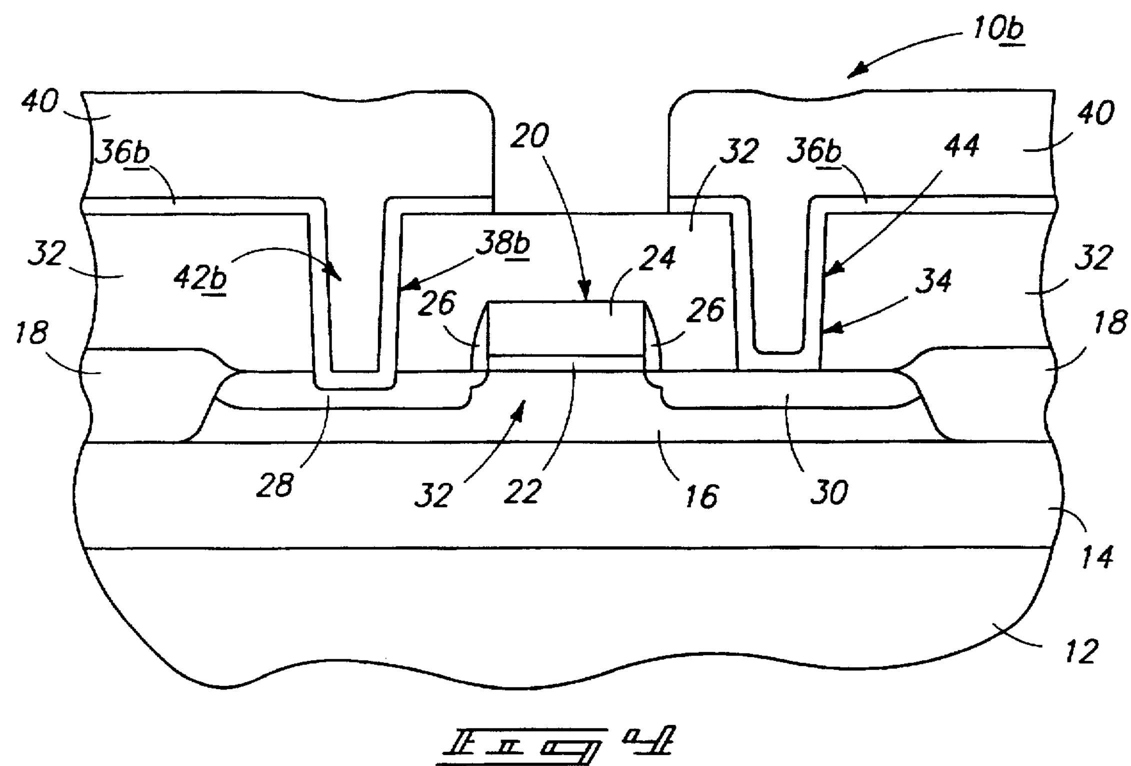
FIG. 4 is a diagrammatic sectional view of an alternate embodiment semiconductor wafer fragment at one processing step in accordance with the invention.

FIGS. 1–3 and 7 illustrate but one example of providing a substrate leaking junction relative to a source, but not a drain, in a field effect transistor. FIG. 4 illustrates another alternate embodiment wafer fragment 10*b*. Like numerals from the first described embodiment are utilized where appropriate, with differences being indicated by the suffix "b", or with different numerals. In this embodiment, source contact opening 38*b* is etched partially into source region 28 to provide the electrical contact within source region 28. TiN barrier layer 36*b* is also provided within contact opening 38*b* and in electrical connection with source 28. The deeper provision of a contact 42*b* within diffusion region 28 will desirably facilitate formation of a substrate leaking junction through source diffusion region 28 to the bulk material of layer 16.

Figure 5:
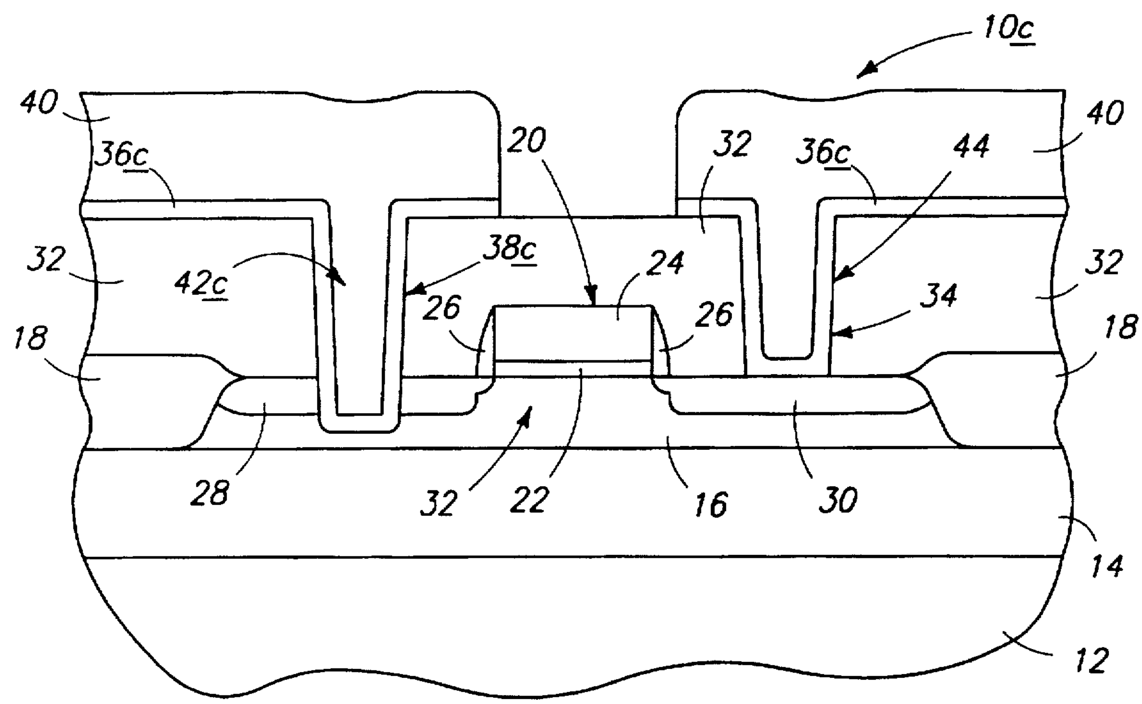
FIG. 5 is a diagrammatic sectional view of another alternate embodiment semiconductor wafer fragment at one processing step in accordance with the invention.

FIG. 5 illustrates another alternate embodiment wafer fragment 10*c*. Like numerals from the first described embodiment are utilized as appropriate, with differences being indicated by the suffix "c" or with different numerals. Here, source contact opening 38*c* is etched completely through source region 28 to provide direct contact of the conductive material of contact 42*c* with the semiconductive material of silicon substrate 16. A barrier layer 36*c* is again utilized as shown.

Figure 6:
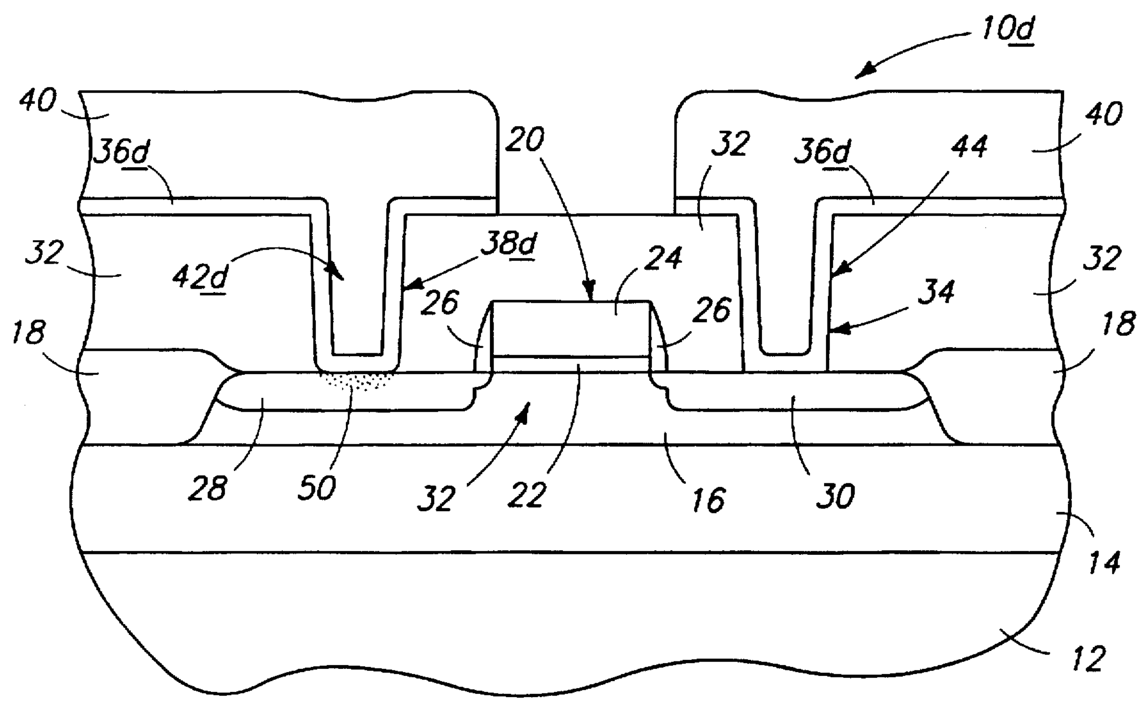
FIG. 6 is a diagrammatic sectional view of still another alternate embodiment semiconductor wafer fragment at one processing step in accordance with the invention.

Yet another alternate example for providing a substrate leaking junction for the source and not the drain is described with reference to FIG. 6. Again, like numerals from the first described embodiment are utilized where appropriate, with differences being indicated with the suffix "d" or with different numerals. Here, a leaking junction is created by provision of an opposite conductivity type implant 50 into source region 28 prior to provision of a barrier layer 36*d*. For example where diffusion region 28 comprises n-type material, region 50 would comprise p-type material. An example p-type dopant concentration for region 50 would be $5\times10^{19}$ ions/$cm^3$ where peak concentration of the n-type material of region 28 would be $1\times10^{20}$ ions/$cm^3$. Such provides another alternate example of creating a substrate leaking junction relative to the source but not the drain. Less desirable in this embodiment is, however, a perceived need to prevent a diffusion region 50 from being created within drain region 30, thus potentially requiring an intervening masking step to prevent such implanting.

The invention also contemplates products produced by the above described processes, as well as field effect transistors produced by other processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a field effect transistor comprising the following steps:

providing a silicon substrate having impurity doping of a first conductivity type;

forming source and drain diffusion regions of a second conductivity type within the silicon substrate, the source region and the drain region being spaced from one another to define a channel region therebetween within the silicon substrate;

forming a barrier layer over the drain region and within the source region;

forming a gate relative to the silicon substrate operatively adjacent the channel region; and forming respective electrical contacts to the source region and the drain region, the electrical contact to the source region penetrating the source region and being separated from the source region by the barrier layer, the electrical contact to the drain region being separated from the drain region by the barrier layer, the forming the electrical contacts comprising etching a source contact opening at least partially into the source region of the silicon substrate, and depositing an electrically conductive material into the source contact opening.

2. The method of forming a field effect transistor of claim 1 comprising providing an electrically conductive barrier material within the source contact opening in electrical connection with the source.

3. The method of forming a field effect transistor of claim 1 wherein the silicon substrate comprises a bulk silicon substrate.

4. A method of forming a field effect transistor comprising the following steps:

providing a silicon substrate having impurity doping of a first conductivity type;

forming source and drain diffusion regions of a second conductivity type within the silicon substrate, the source region and the drain region being spaced from one another to define a channel region therebetween within the silicon substrate;

forming a barrier layer over the drain region and entirely through the source region;

forming a gate relative to the silicon substrate operatively adjacent the channel region; and forming respective electrical contacts to the source region and the drain region, the electrical contact to the source region penetrating entirely through the source region, the electrical contact to the drain region being separated from the drain region by the barrier layer, the forming the electrical contacts comprising etching a source contact opening substantially through the source region within the silicon substrate, and depositing an electrically conductive material into the source contact opening.

5. The method of forming a field effect transistor of claim 4 comprising providing an electrically conductive barrier material within the source contact opening in electrical connection with the source.

6. The method of forming a field effect transistor of claim 4 wherein the silicon substrate comprises a bulk silicon substrate.

* * * * *